United States Patent [19]
Nitsch et al.

[11] Patent Number: 5,168,430
[45] Date of Patent: Dec. 1, 1992

[54] FLEXIBLE PRINTED CIRCUIT CONNECTING MEANS FOR AT LEAST ONE HYBRID CIRCUIT STRUCTURE AND A PRINTED CIRCUIT BOARD

[75] Inventors: Manfred Nitsch, Schwieberdingen; Peter Werner, Wiernsheim-Iptingen; Dieter Günther, Murr/Murr; Herbert Arnold, Eberdingen; Willy Bentz, Sachsenheim; Michael Horbelt, Vaihingen/Enz; Willi Gansert, Kornwestheim; Dietrich Bergfried, Böblingen; Werner Auth, Stuttgart; Ulrich Konzelmann, Wuppertal, all of Fed. Rep. of Germany

[73] Assignee: Robert Bosch GmbH, Stuttgart, Fed. Rep. of Germany

[21] Appl. No.: 342,371

[22] Filed: Apr. 21, 1989

[30] Foreign Application Priority Data

Apr. 22, 1988 [DE] Fed. Rep. of Germany ..... 3813565

[51] Int. Cl.⁵ ............................................. H05K 1/00
[52] U.S. Cl. ................................... 361/398; 174/268; 361/412
[58] Field of Search ............... 174/252, 254; 361/388, 361/390, 398, 412, 413; 439/77

[56] References Cited

U.S. PATENT DOCUMENTS

| | | | |
|---|---|---|---|
| 3,221,286 | 11/1965 | Fedde | 361/398 |
| 3,579,206 | 5/1971 | Grange | 174/252 |
| 3,766,439 | 11/1973 | Isaacson | 174/252 |
| 3,971,127 | 7/1976 | Giguere et al. | 174/252 |
| 4,495,546 | 1/1985 | Nakamura et al. | 361/398 |
| 4,509,095 | 4/1985 | Boros | 361/398 |
| 4,858,071 | 8/1989 | Mauabe et al. | 361/398 |

FOREIGN PATENT DOCUMENTS 0145361  12/1980  Fed. Rep. of Germany ...... 361/398

OTHER PUBLICATIONS

IBM Technical Disclosure Bulletin vol. 26 No. 12 May 1984.
IBM Technical Disclosure Bulletin vol. 14 No. 10 Mar. 1972.

Primary Examiner—Leo P. Picard
Assistant Examiner—Donald Sparks
Attorney, Agent, or Firm—Michael J. Striker

[57] ABSTRACT

The flexible printed circuit device, includes at least one hybrid circuit structure having assigned contact areas, a rigid printed circuit board, a flexible printed circuit board portion also having assigned contact areas on one end region thereof and being connected electrically to the rigid printed circuit board, a plurality of bonding electrical conductors, each of the electrical conductors being bonded at one end thereof to one of the assigned contact areas on the at least one hybrid circuit structure and, at the other end thereof, to one of the assigned contact areas on the end region of the flexible printed circuit board portion; and a rigid support, the hybrid circuit structure being mounted on the rigid support. The end region of the flexible printed circuit board portion is fixedly mounted on the rigid support in side-by-side relationship with the hybrid circuit structure. A protective frame is provided enclosing the electrical conductors electrically connecting the assigned contact areas on the hybrid circuit structure and the end region of the flexible printed circuit board portion.

11 Claims, 2 Drawing Sheets

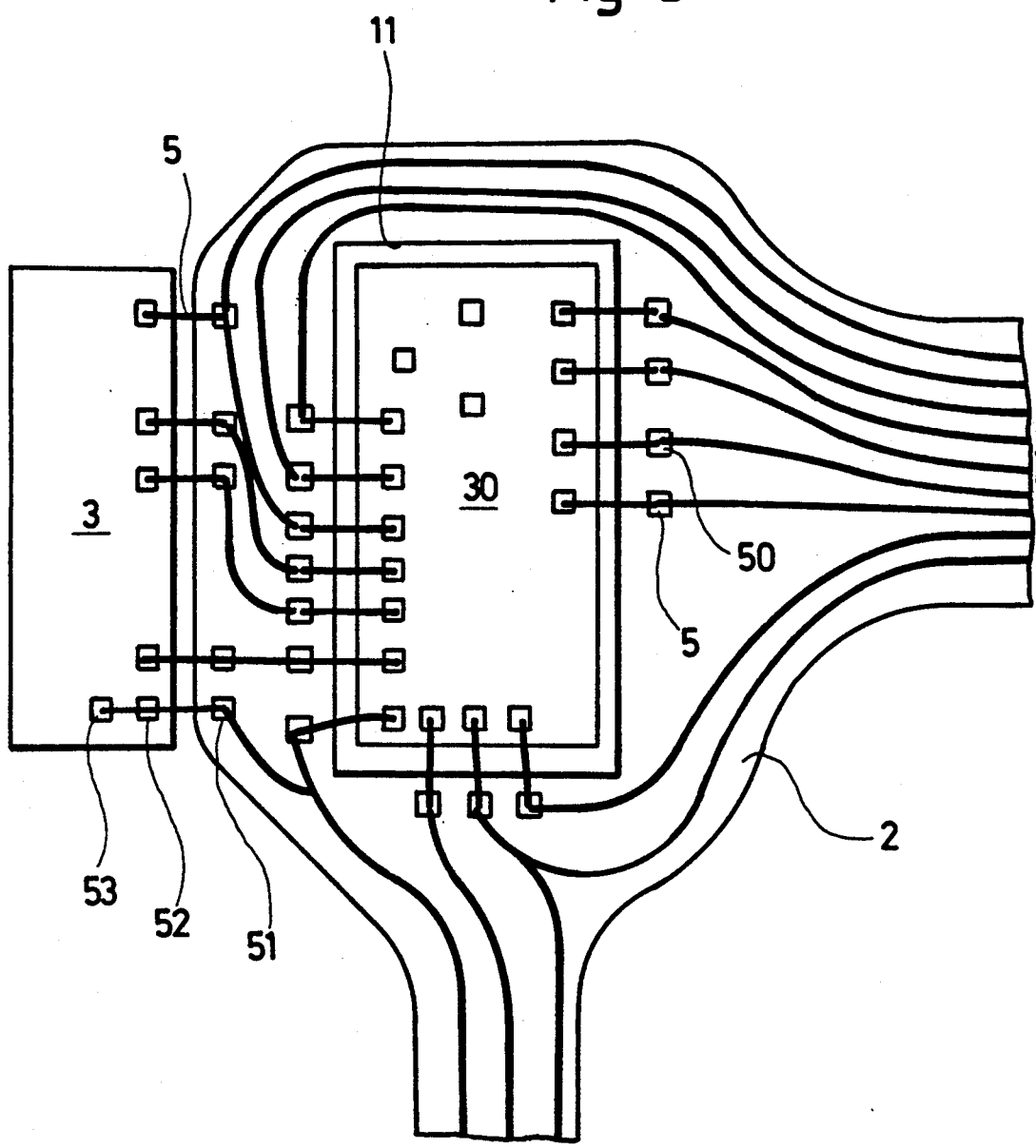

5,168,430

FLEXIBLE PRINTED CIRCUIT CONNECTING MEANS FOR AT LEAST ONE HYBRID CIRCUIT STRUCTURE AND A PRINTED CIRCUIT BOARD

BACKGROUND OF THE INVENTION

The present invention relates to an electrical printed circuit connecting means for connecting hybrid circuit structures to printed circuit boards.

Known electrical connections of hybrid circuit structures to printed circuit boards consist of rigid comb-like connecting members which are soldered both to the hybrid circuit structure and to the conductors of the printed circuit board. However there is no thermal coupling between the hybrid circuit structure and a housing enclosing the connections so that temperature fluctuations do not load the electrical connections.

In another prior art electrical connecting device bonded contacts are provided between an external plug junction and the hybrid circuit structure. In this structure however it is not possible to electrically connect hybrid components to printed circuit boards for example.

It is also known to apply a hybrid circuit structure directly to the printed circuit board, that means to provide a rigid assembly wherein the electrical connections are established by means of bonding. In this manner the electrical contacts or connections were sufficiently temperature resistant and shock proof. By the rigid union of the hybrid circuit structures and the printed circuit board however, it is not possible to provide electrical contacts at arbitrary points or sides of the hybrid circuit structure. For example, if the printed circuit board for technological reasons is provided with a rigid component, for example a plug connector, then in this region it is impossible to provide bonded connections having sufficient resistance against temperature changes.

SUMMARY OF THE INVENTION

It is therefore a general object of this invention to overcome the above disadvantages.

More particularly, it is an object of this invention to provide an improved electrical connection of hybrid circuit structures to printed circuit boards wherein the electrical conductors between a hybrid circuit structure which is fixedly mounted on a support such as for example a heat sink plate and a printed circuit board, are not strained by temperature fluctuations.

Another object of this invention is to provide an improved electrical connection wherein the printed circuit board and the hybrid circuit structure can be mounted at different positions.

Still another object of this invention is to provide such an improved connection wherein the distance between the discrete components on the printed circuit board and the hybrid circuit structure can be arbitrarily selected without straining the interconnections due to their changes in length at temperature fluctuations.

Still another object of this invention is to provide such an improved connection which is resistant against mechanical loads, for example against vibrations.

In keeping with these objects and others which will become apparent hereafter, one feature of this invention resides in the provision of at least one flexible printed circuit board portion connected to the printed circuit board, and electrical conductors bonded at one end thereof to assigned contact areas on the hybrid circuit structure and at the other end thereof, to assigned contact areas on the flexible printed circuit board portion.

The flexible printed circuit board portion is secured directly in a fixed relationship to the hybrid circuit structure on the supporting plate.

The flexible printed circuit board portion may be either an integral part of the printed circuit board to which the hybrid circuit structure is connected electrically or else the flexible printed circuit board portion can be secured and connected to the printed circuit board to which the hybrid circuit structure is connected electrically. The printed circuit board to which the hybrid circuit structure is connected electrically may be rigid either in part or in its entirety.

A protective frame can be provided enclosing the electrical conductors bonded to the hybrid circuit structure and the end region of the flexible printed circuit board portion.

The electrical connection can also be provided with tension relief means arranged between the protective frame and the flexible printed circuit board portion.

In some embodiments of the invention, the flexible printed circuit board portion can have a cutout in which the hybrid circuit structure is located.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWING

FIG. 3 is a plan view of another embodiment of the electrical connection for a plurality of hybrid circuit structures.

DESCRIPTION OF THE PREFERRED EMBODIMENTS

Figure 1:
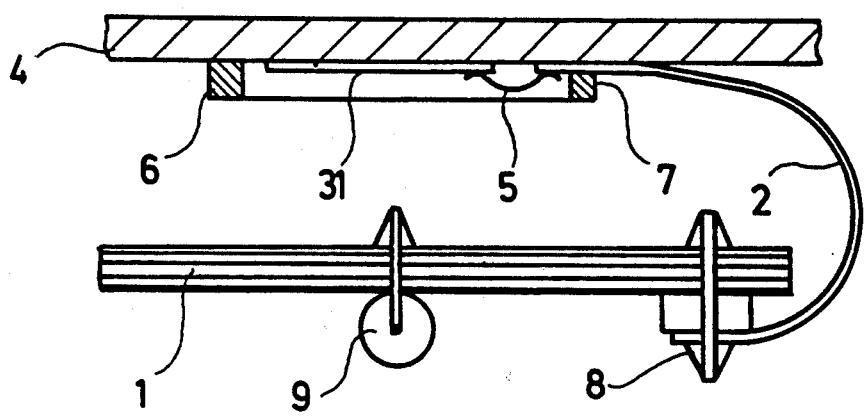
FIG. 1 shows schematically a sectional side view of a first embodiment of the electrical connection of this invention, in which the flexible printed circuit board portion is a separate component from the printed circuit board to which the hybrid circuit structure is to be connected.

Referring to FIG. 1, there is illustrated a rigid printed circuit board 1, a flexible printed circuit board portion 2, a hybrid circuit structure 3 and a heat sink plate 4 serving as a support for the structure 3. The hybrid circuit structure 3 which can be designed as a thin film or thick film hybrid circuit is applied on the heat sink plate 4 by means of a suitable adhesive. The end portion of the flexible printed circuit board portion 2 which is arranged side-by-side the hybrid circuit structure 3 is also attached to the heat sink plate 4 in a suitable manner, for example by cementing.

The electrical connections between the hybrid circuit structure 3 and the flexible printed circuit board portion 2 are made by bonded conductors 5. To protect the hybrid circuit structure and its electrical connections against external influences a protective frame 6 is provided in the vicinity of an end region of the flexible printed circuit board portion 2. The protective frame 6 has with a tension relief member 7. The latter creates an additional protection of the electrical connections of the hybrid circuit structure against mechanical loads. The tension relief member is secured for example by a suitable adhesive acting as a tension relief means to the flexible printed circuit board portion 2. In a modification, the tension relief means can also comprise projections of the protective frame 6, which engage corresponding recesses or holes in the flexible printed circuit board portion 2.

The other end portion of the flexible printed circuit board portion 2 is joined in a suitable manner with a rigid printed circuit board 1. As shown in the drawing, the joint is made for example by a draw or dip soldered contact piece 8. In addition, the rigid printed circuit board 1 supports discrete electrical component parts 9 of which one is illustrated by way of an example.

From the illustration it is evident that conventional, rigid printed circuit boards can h=electrically connected with the hybrid circuit structure by the flexible printed circuit board portion at suitable contact points or areas on the rigid printed circuit board by dip soldered contact pieces 8. The opposite end portion of the flexible printed circuit board portion 2 is directed against a lateral side of the hybrid circuit structure 3 and is cemented on the same supporting plate, for example a heat sink plate This opposite end portion of the flexible printed circuit board portion is provided with a plurality of contact areas coated for example with aluminum, nickel or gold suitable for bonding connections. The electrical connection between the assigned contact surfaces or points on the hybrid circuit structure 3 and the contact areas or points on the printed circuit board are created by the bonded conductor 5. It is evident that due to the cementing of the end portion of the flexible printed circuit board portions to the rigid support plate upon which the hybrid circuit structure is also fixedly mounted, any loads due to temperature fluctuations and due to mechanical forces do not impair the bonded electrical conductors 5.

Figure 2:
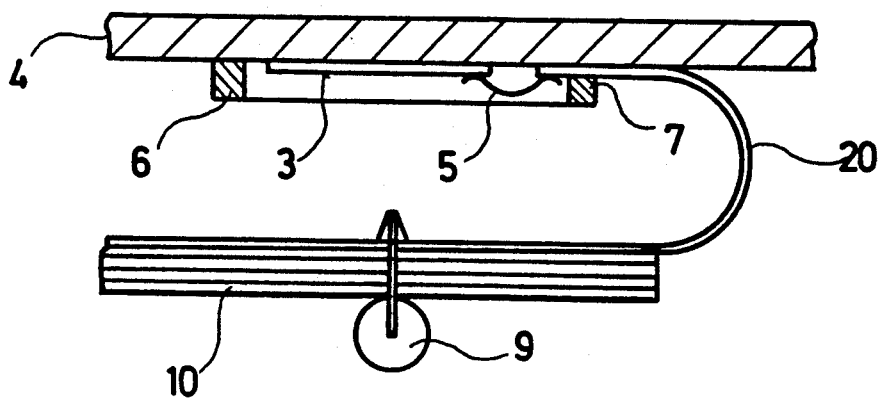
FIG. 2 shows a modification of the embodiment of FIG. 1, in which the flexible printed circuit board portion is an integral part of the printed circuit board to which the hybrid circuit structure is to be connected.

In the embodiment of FIG. 2, corresponding component parts are designated by like reference numerals.

It will be seen from FIG. 2 that a flexible printed circuit board 20 has a reinforced rigid portion 10 for supporting discrete component parts 9; the opposite end, similarly as in the preceding example, is cemented to a support, for example to a heat sink plate 4. In the proximity of the end portion of the flexible printed circuit board a hybrid circuit structure 3 is applied on the supporting plate, again for example by cementing. Contact points or areas on the cemented end portion of the flexible printed circuit board 20 are again interconnected with the assigned contact areas on the hybrid circuit structure 3 by bonded conductors 5. The entire hybrid circuit structure 3 and the bonded connections are again protected against environment by a protective frame 6. A tension relief means is provided for the bonding wires or conductors 5 to prevent them from being put under tension. This tension relief means includes a tension relief member 7 of the protective frame 6 and an adhesive necessary to secure it to the flexible printed circuit board portion.

In this manner through the reinforcement of the flexible printed circuit board 20 it is possible to create immediately an electrical connection to the hybrid circuit structure without the need of separate contact pieces 8 between the rigid and flexible parts of the board as in the embodiment of FIG. 1.

In the embodiment of FIG. 3, a plurality of hybrid circuit structures 3 and 30 are connected to the flexible printed circuit board 2. Similarly as in the preceding examples, the end portion of the flexible board is applied on a supporting plate, for example on a heat sink plate. The end portion of the flexible board 2 is provided with a cutout 11 in which a hybrid circuit structure 30 is located. The contact areas 50 on the board 2 can be arranged around the cutout 11 and can be electrically connected by bonded conductors to assigned contact points on the hybrid circuit structure 30. As a result, a high adaptability of the arrangement of electrical connections is achieved.

Further hybrid circuit structures having contact points 52 and 53 can be connected to assigned contact areas 51 on the flexible printed circuit board 2 by the bonded conductors 5. A separate flexible printed circuit board can be connected in the same fashion to the contact area on the additional structure 3. The parts of the flexible printed circuit board which are cemented to the underlying heat sink plate 4 is integrally connected via the self-supporting flexible portion of the board to the reinforced rigid board portion similarly as in FIG. 2. Alternatively, the self-supporting flexible printed circuit board part can be again fastened to a separate rigid printed circuit board in the manner illustrated in FIG. 1. The bonding connections in the embodiment of FIG. 3 are again protected by a non-illustrated protection frame.

While the invention has been illustrated and described as embodied in flexible printed circuit device, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A flexible printed circuit device, comprising at least one hybrid circuit structure having assigned contact areas, a printed circuit board, a flexible printed circuit board portion also having assigned contact areas on one end region thereof and being connected electrically to the printed circuit board; a plurality of electrical conductors, each of said electrical conductors being bonded at one end thereof to one of the assigned contact areas on the at least one hybrid circuit structure and, at the other end thereof, to one of the assigned contact areas on the end region of the flexible printed circuit board portion; and a rigid support, said hybrid circuit structure being mounted on said rigid support, and a protective frame enclosing the electrical conductors bonded to the assigned contact areas on the hybrid circuit structure and the ned region of the flexible printed circuit board portion, wherein the end region of the flexible printed circuit board portion is fixedly mounted on the rigid support in a fixed relationship to the hybrid circuit structure.

2. A flexible printed circuit device as defined in claim 1, further comprising tension relief means for securing relative to the hybrid circuit structure the end region of the flexible printed circuit board portion having the assigned contact areas for the electrical conductors to relieve the electrical conductors of tension.

3. A flexible printed circuit device as defined in claim 1, further comprising a dip soldered contact piece securing the flexible printed circuit board portion to the printed circuit board.

4. A flexible printed circuit device, comprising at least one hybrid circuit structure having assigned contact areas, a printed circuit board, a flexible printed circuit board portion also having assigned contact areas on one end region thereof and being connected electrically to the printed circuit board; a plurality of electrical conductors, each of said electrical conductors being bonded at one end thereof to one of the assigned contact areas on the at least one hybrid circuit structure and, at the other end thereof, to one of the assigned contact areas on the end region of the flexible printed circuit board portion; and a rigid support, said hybrid circuit structure being mounted on said rigid support, and the end region of the flexible printed circuit board portion being fixedly mounted on the rigid support in side-by-side relationship with the hybrid circuit structure, wherein the printed circuit board has a rigid portion formed by reinforcement of a part of a flexible board, so that the printed circuit board is made form the flexible board.

5. A flexible printed circuit device as defined in claim 1, wherein the flexible printed circuit board portion has a cutout in which the hybrid circuit structure is located.

6. A flexible printed circuit device, comprising at least one hybrid circuit structure having assigned contact areas, a printed circuit board, a flexible printed circuit board portion also having assigned contact areas on one end region thereof and being connected electrically to the printed circuit board; a plurality of electrical conductors, each of said electrical conductors being bonded at one end thereof to one of the assigned contact areas on the at least one hybrid circuit structure and, at the other end ,thereof, to one of the assigned contact areas on the end region of the flexible printed circuit board portion to provide a bonded electrical connection therebetween; and a rigid support, said hybrid circuit structure being mounted on said rigid support and the end region of the flexible printed circuit board portion being fixedly mounted on the rigid support in side-by-side relationship with the hybrid circuit structure.

7. A flexible printed circuit device as defined in claim 6, further comprising a protective frame enclosing the electrical conductors bonded to the assigned contact areas on the hybrid circuit structure and the end region of the flexible printed circuit board portion.

8. A flexible printed circuit device as defined in claim 6, wherein the printed circuit board has a rigid portion formed by reinforcement of a part of flexible board, the printed circuit board being made from the flexible board.

9. A flexible printed circuit device as defined in claim 6, wherein the flexible printed circuit board portion has a cutout in which the hybrid circuit structure is located.

10. A flexible printed circuit device as defined in claim 7, further comprising tension relief means for securing the end region of the flexible printed circuit board portion having the contact areas for the electrical conductors to prevent the electrical conductors from being put under tension.

11. A flexible printed circuit device as defined in claim 10, wherein said protective frame has a tension relief member and said tension relief means comprises said tension relief member and an adhesive, said tension relief member of said protective frame being secured to the end region of the flexible printed circuit board portion by said adhesive.

* * * * *